United States Patent [19]

Pang

[11] Patent Number: 4,581,673

[45] Date of Patent: Apr. 8, 1986

[54] APPARATUS AND METHOD FOR PROTECTION AND RECOVERY FROM LATCH-UP OF INTEGRATED CIRCUITS

[75] Inventor: Tet C. Pang, Tempe, Ariz.

[73] Assignee: Motorola, Inc., Schaumburg, Ill.

[21] Appl. No.: 576,245

[22] Filed: Feb. 2, 1984

[51] Int. Cl.$^4$ ............................................... H02H 9/00
[52] U.S. Cl. ........................................ 361/58; 361/91; 361/111; 307/318
[58] Field of Search ................... 361/88, 91, 111, 110, 361/98, 57, 58; 307/542, 545, 318, 572, 576, 200 A, 200 B, 605, 324, 308; 357/42, 47, 28, 87

[56] References Cited

U.S. PATENT DOCUMENTS

| | | | |
|---|---|---|---|
| 2,561,202 | 7/1951 | Houser et al. | |
| 3,497,721 | 4/1966 | Dexter . | |
| 3,979,607 | 9/1976 | Beelitz et al. | 307/542 |
| 4,090,227 | 5/1978 | Schweitzer | 361/57 |
| 4,158,178 | 6/1979 | Schade, Jr. | 361/91 X |
| 4,178,619 | 12/1979 | Seiler et al. | 307/318 X |
| 4,322,770 | 3/1982 | Sendelweck | 361/111 X |
| 4,367,509 | 1/1983 | Snyder et al. | 361/111 X |
| 4,413,300 | 11/1983 | Sumi et al. | 330/298 X |

Primary Examiner—A. D. Pellinen
Assistant Examiner—Derek S. Jennings
Attorney, Agent, or Firm—Raymond J. Warren

[57] ABSTRACT

A method and apparatus for preventing latch-up caused by spurious signals reaching the input and output ports of an IC. The apparatus consists of a current regulating diode that limits the current entering the IC to a level below the latch-up holding level preventing the IC from being latched up. The method and apparatus further allows the recovery of an IC that has been latched-up through external transient ionizing radiation by limiting the current through the IC below the latch-up holding current level.

5 Claims, 2 Drawing Figures

APPARATUS AND METHOD FOR PROTECTION AND RECOVERY FROM LATCH-UP OF INTEGRATED CIRCUITS

BACKGROUND OF THE INVENTION

1. Field of the Invention

This invention relates, in general, to protection of integrated circuits and more particularly to protection and recovery from latch-up of integrated circuits.

2. Description of Background

Typically, latch-up and subsequent burn-out of some junction isolated integrated circuits (IC) may be caused by either internal or external sources. Voltage transients of the power supply line or propagation of spurious signals such as negative voltage spikes into an input port of the IC are examples of internal sources. These internal sources trigger the IC into a latch-up condition characterized by a high conduction current. When this occurs, burn-out of the IC is possible should there be no means to limit the amount of current through the IC. Presently, latch-up is prevented through the use of circuitry in the power supply line and the input ports. This tends to delay the signal processing of the IC and increase the cost of the overall device using the IC.

An example of an external source causing latch-up would be transient ionizing radiation from a nuclear explosion or the like. This radiation would generate a photo-current which would trigger a latch-up prone IC into the high conduction state. Currently there is no practical way such as spot-shielding to prevent nuclear ionizing radiation from reaching the IC and triggering the IC into latch-up.

The current method generally used to prevent latch-up is to limit the maximum IC current with a resistor to a value below the holding current of the IC. The disadvantage of this method is the need to know in advance the holding current in order to properly select a resistor that would limit the current below the holding current. In addition, the voltage drop across the resistor may be greater than the allowable limits.

One method currently used to prevent latch-up induced by transient ionizing radiation is through the use of an inductance-capacitance network in the supply line. This network is designed to slow down the increase in current flowing into the affected IC. The time constant of the network is to be significantly long relative to charge storage and recombination time of the affected IC. This method requires knowledge of the latch-up on-set current and the charge storage and recombination time of the IC.

Presently should latch-up occur the only way to delatch an IC is to shut down the circuit, which generally means shutting down the entire system, and then turning the system on again. This can cause intolerable delays of time and prevent use of any apparatus using a latched-up IC.

SUMMARY OF THE INVENTION

Accordingly it is an object of the present invention to provide and improved apparatus and method that will prevent latch-up caused by spurious signals reaching the input or output ports of the IC.

Another object of the present invention is to provide an apparatus and method that requires a reduced amount of external circuitry to prevent latch-up from spurious signals.

Still another object of the present invention is to provide an apparatus and method that will be immune to latch-up from transient ionizing radiation.

Yet another object of the present invention is to provide an apparatus and method that does not have to be shut down to be delatched.

Yet another object of the present invention is to provide an apparatus and method that reduces the time required to delatch a latched-up IC.

Yet another object of the present invention is to provide an apparatus and method that prevents latch-up without causing an excessive drop in supply voltage to the IC.

Yet another object of the present invention is to provide an apparatus and method that only affects the latched-up IC.

The above and other objects and advantages of the present invention are achieved by a particular embodiment which comprises an apparatus and method for protection and recovery from latch-up of integrated circuits.

A current regulator diode and a resistor are placed in line between the power source and the IC. This design prevents latch-up when ionization of the IC occurs from spurious signals entering through the input or output ports. Latch-up is prevented by restricting the current flow into the IC from the power source to below the latch-up holding current without causing excessive voltage drop in the power supply voltage to the IC.

Further, the diode and resistor allow the IC device to recover from latch-up that is caused by external forces, such as nuclear radiation. When the diode recovers from the ionizing effects it will limit the current into the IC device to below the latch-up holding current level allowing the IC to delatch without turning off the power supply.

DETAILED DESCRIPTION OF THE INVENTION

Figure 1:
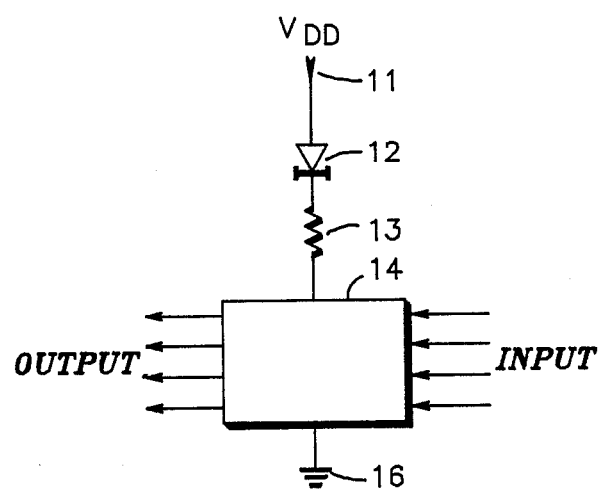
FIG. 1 is a schematic diagram of a circuit embodying the present invention.

Referring to the schematic diagram of FIG. 1, a diagram embodying the present invention is illustrated. A diode 12 is placed in line between a power source node 11 and an integrated circuit 14. Diode 12 is a current regulator diode, and by way of example only, is of the 1N5305 type made and sold by Motorola, Inc. Diode 12 has its cathode coupled to IC 14 through a resistor 13. Connected to IC 14 are inputs, outputs and a ground 16. This circuit requires only that a single current regulator diode, 12, be added to protect the circuit from latch-up. This is much less circuitry than is currently used (e.g. placing a diode on each input and output line, or using a radiation detector and associated circuitry to recycle the power supply for delatching) to protect from latch-up and, as a result, is more economical. When IC 14 is ionized diode 12 limits the current flow to a level below the latch-up holding level allowing IC 14 to recover from latch-up or prevent it altogether. This process will be more fully discussed below.

Figure 2:
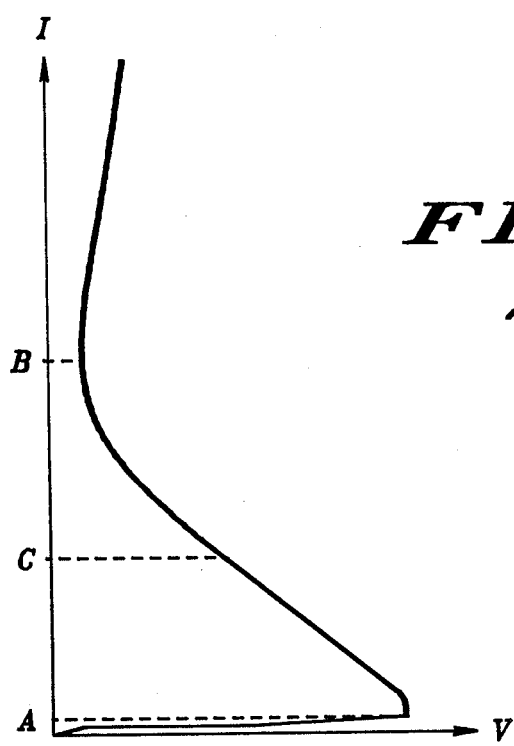
FIG. 2 is a graph of the current and voltage across a circuit embodying the present invention when subjected to ionizing effects.

Referring now to FIG. 2 a graph of current and voltage levels across IC 14 is illustrated. Point A represents the normal operating level of IC 14.

In one situation latch-up of IC 14 is caused by spurious signals, such as negative voltage spikes, at the input or output ports. These spurious signals cause the injection of carriers which change IC 14 into a low impedance state and allow a higher current level to pass through IC 14. Without diode 12 or resistor 13 the current through IC 14 would increase and IC 14 become nonfunctional or latched-up. Adding resistor 13 limits the voltage across IC 14 to a safe region below the burn-out level. In this situation, without diode 12, the current level would raise to a point above the latch-up holding current, B, and keep IC 14 latched-up until reduced below latched-up holding level B. Diode 12 prevents the current from exceeding holding level B by limiting the current through IC 14 to a level C below holding level B. In this situation current regulator diode 12, FIG. 1, will prevent IC 14 from being latched-up. This method eliminates latch-up caused from spurious signals and eliminates the need to turn off the circuit to recover from latch-up.

In a different situation IC 14 may be triggered into latched-up by transient ionizing radiation external to the circuit. This radiation will cause ionization in IC 14 and diode 12 allowing the current through the circuit to increase above latch-up holding level B, FIG. 2. Resistor 13 again will prevent IC 14 from being burned-out by limiting the voltage across IC 14. After the external radiation ceases, IC 14 will be in a temporary latch-up mode due to the increased current from the ionization in diode 12. However diode 12 will recover from the effects of the ionizing radiation after a time determined by the recombination time of the excess carriers in the current regulator diode 12. The recombination time is the time it takes for the excess carriers created by the radiation to recombine. When this has taken place, the current through IC 14 will then be limited to point C, FIG. 2, below holding level B. At this level IC 14 will delatch and come out of the low impedance state. This method eliminates the need of spot shielding the circuitry and requires less time to recover from latch-up since the power does not need to be shut down. In this situation only the circuit affected by the radiation will be corrected, the entire system will not need to be shut down.

Accordingly, it has been shown that the present invention provides an apparatus and method that will prevent latch-up caused from spurious signals reaching the input or output ports of an IC and that will allow the IC to recover from ionization caused by transient radiation. It has also been shown that the current regulator diode eliminates the need to determine the holding current for the selection of resistor to prevent latch-up. Further, this apparatus accomplishes this with less circuitry than previously required and without spot shielding the IC. In addition, this method does not require the entire device be shutdown and only effects the ionized IC.

While a preferred embodiment of the present invention has been disclosed and described, it will be obvious to those skilled in the art that various modifications and substitutions may be made without departing from the spirit and scope of the invention, and it is therefor intended that the appended claims cover all such modifications and substitutions.

I claim:

1. Latch-up prevention and recovery apparatus having a power supply node and a circuit node, said apparatus comprising:
   a voltage source being coupled to said power supply node;
   an IC device having a power lead coupled to said circuit node of said apparatus;
   latch-up prevention and recovery means for limiting the current flow through said IC device from said voltage source resulting from spurious signals or transient radiation, said latch-up prevention and recovery means having a first lead and a second lead, said first lead being coupled to said power supply node; and
   burn-out prevention means for preventing said IC from being burned-out from spurious signals or transient radiation, said burn-out prevention means having a first lead and a second lead, said first lead being coupled to said second lead of said latch-up prevention and recovery means and said second lead being coupled to said power lead of said IC device.

2. The apparatus of claim 1 wherein said burn-out prevention means includes a resistor.

3. The apparatus of claim 2 wherein said latch-up prevention and recovery means includes a current regulator diode having a first lead and a second lead, said first lead being coupled to said first lead of said resistor and said second lead being coupled to said power supply node.

4. A method of recovering from latch-up of an IC device when said IC device is exposed to transient ionizing radiation, said method comprising the steps of:
   connecting a diode and resistor in series with a power supply node to said IC device;
   exposing said IC device to said transient radiation causing ionization in said IC device and said diode;
   creating an increased number of carriers in said IC device and said diode;
   increasing a current level passing through said IC device and said diode above a latch-up holding level causing said IC device to latch-up;
   limiting an amount of voltage developed across said IC during ionization;
   recombining said increased number of carriers in said diode;
   decreasing said current level through said diode and said IC device below said latch-up holding level; and
   limiting an amount of current flow through said IC to below a latch-up holding level.

5. The method of claim 4 further comprising using a current regulator diode as the diode in series with the resistor.

* * * * *